(12) United States Patent
Chang et al.

(10) Patent No.: US 12,677,433 B2
(45) Date of Patent: Jul. 7, 2026

(54) METHOD FOR FORMING SEMICONDUCTOR DEVICE STRUCTURE WITH PROTECTION LAYER

(71) Applicant: Taiwan Semiconductor Manufacturing Company, Ltd., Hsinchu (TW)

(72) Inventors: Kung-Pin Chang, Nantou Township, Nantou County (TW); Yi-Ting Lin, Hsinchu City (TW); Wen-Chiang Hong, Taipei City (TW); Yao-Kwang Wu, Hsinchu (TW); Jyh-Huei Chen, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 358 days.

(21) Appl. No.: 18/479,954

(22) Filed: Oct. 3, 2023

(65) Prior Publication Data

US 2025/0113519 A1 Apr. 3, 2025

(51) Int. Cl.
| | |
|---|---|
| *H10D 30/01* | (2025.01) |
| *H10D 30/43* | (2025.01) |
| *H10D 30/67* | (2025.01) |
| *H10P 50/00* | (2026.01) |
| *H10P 50/28* | (2026.01) |

(52) U.S. Cl.
CPC ......... *H10D 30/031* (2025.01); *H10D 30/014* (2025.01); *H10D 30/43* (2025.01); *H10D 30/6757* (2025.01); *H10P 50/283* (2026.01); *H10P 50/73* (2026.01); *H10D 30/6735* (2025.01)

(58) Field of Classification Search
CPC ... H10D 30/3675; H10D 30/031; H10D 30/62
See application file for complete search history.

(56) References Cited

U.S. PATENT DOCUMENTS

| | | | |
|---|---|---|---|
| 9,209,247 | B2 | 12/2015 | Colinge |
| 9,236,267 | B2 | 1/2016 | De |
| 9,412,817 | B2 | 8/2016 | Yang |
| 9,412,828 | B2 | 8/2016 | Ching |
| 9,472,618 | B2 | 10/2016 | Oxland |
| 9,502,265 | B1 | 11/2016 | Jiang |

(Continued)

*Primary Examiner* — Yu-Hsi D Sun
(74) *Attorney, Agent, or Firm* — McClure, Qualey & Rodack, LLP

(57) ABSTRACT

A method for forming a semiconductor device structure is provided. The method includes providing a substrate and a nanostructure stack. The method includes forming an isolation layer over the base and surrounding the fin. The method includes forming a first protection layer over the nanostructure stack and the isolation layer. The method includes forming a second protection layer over the first protection layer. The method includes forming a mask layer over the second protection layer. The top portion of the second protection layer protrudes from the mask layer. The method includes thinning the top portion of the second protection layer. The method includes removing the mask layer. The method includes removing the first protection layer and the second protection layer over the nanostructure stack. The method includes forming a gate stack wrapped around the nanostructure stack.

20 Claims, 16 Drawing Sheets

(56) References Cited

U.S. PATENT DOCUMENTS

| 9,520,482 | B1 | 12/2016 | Chang | |
| 9,536,738 | B2 | 1/2017 | Huang | |
| 9,576,814 | B2 | 2/2017 | Wu | |
| 9,608,116 | B2 | 3/2017 | Ching | |
| 2023/0006051 | A1* | 1/2023 | Pan | H10D 84/0151 |
| 2024/0088217 | A1* | 3/2024 | Chu | H10D 62/115 |

* cited by examiner

METHOD FOR FORMING SEMICONDUCTOR DEVICE STRUCTURE WITH PROTECTION LAYER

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1G are cross-sectional views of various stages of a process for forming a semiconductor device structure, in accordance with some embodiments.

FIG. 1A-1 is a top view of the semiconductor device structure of FIG. 1A, in accordance with some embodiments.

FIG. 1A-2 is a perspective view of the semiconductor device structure of FIG. 1A, in accordance with some embodiments.

FIG. 1G-1 is a top view of the semiconductor device structure of FIG. 1G, in accordance with some embodiments.

FIG. 1G-2 is a perspective view of the semiconductor device structure of FIG. 1G, in accordance with some embodiments.

FIG. 2F-1 is a top view of the semiconductor device structure of FIG. 2F, in accordance with some embodiments.

FIG. 2F-2 is a cross-sectional view illustrating the semiconductor device structure along a sectional line II-II' in FIG. 2F-1, in accordance with some embodiments.

DETAILED DESCRIPTION

Figures 1, 1A:
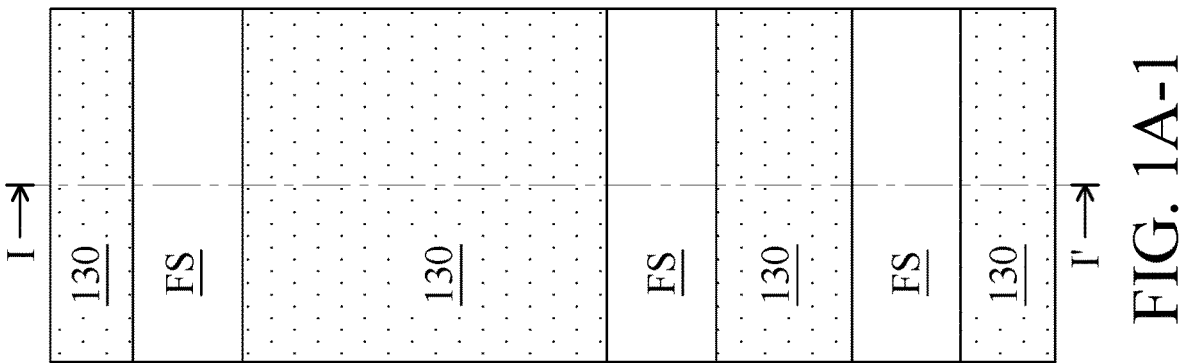

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1A-1G are cross-sectional views of various stages of a process for forming a semiconductor device structure, in accordance with some embodiments. FIG. 1A-1 is a top view of the semiconductor device structure of FIG. 1A, in accordance with some embodiments.

Figures 1, 1A, 2:
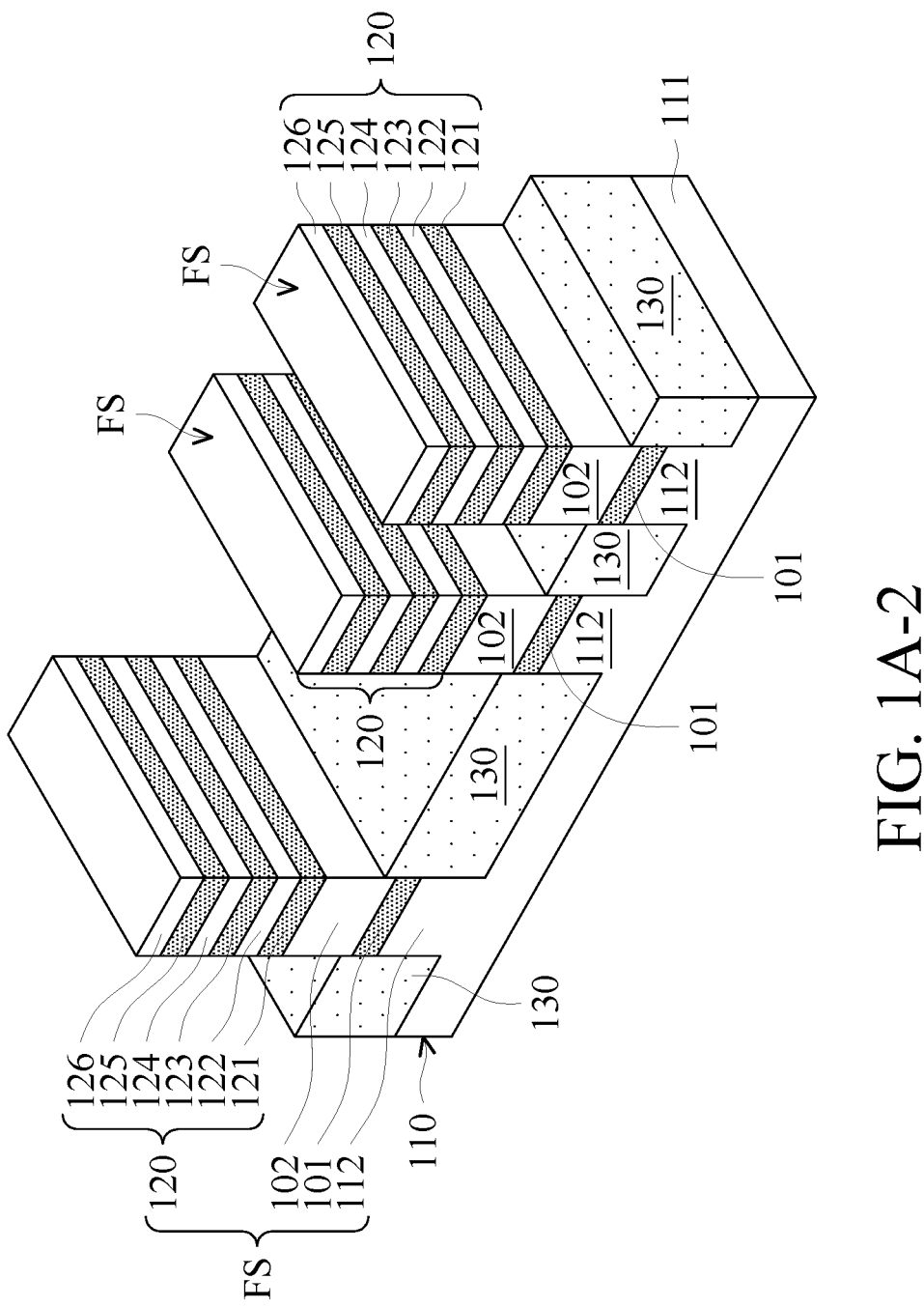

FIG. 1A is a cross-sectional view illustrating the semiconductor device structure along a sectional line I-I' in FIG. 1A-1, in accordance with some embodiments. FIG. 1A-2 is a perspective view of the semiconductor device structure of FIG. 1A, in accordance with some embodiments.

As shown in FIGS. 1A and 1A-2, a substrate 110 is provided, in accordance with some embodiments. The substrate 110 has a base 111 and fins 112 over the base 111, in accordance with some embodiments.

The substrate 110 includes, for example, a semiconductor substrate. The substrate 110 includes, for example, a semiconductor wafer (such as a silicon wafer) or a portion of a semiconductor wafer. In some embodiments, the substrate 110 is made of an elementary semiconductor material including silicon or germanium in a single crystal structure, a polycrystal structure, or an amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity.

Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1A and 1A-2, semiconductor layers 101 and 102 are sequentially formed over the fins 112, in accordance with some embodiments. The semiconductor layer 101 is made of a semiconductor material different from that of the substrate 110, in accordance with some embodiments.

The semiconductor layer 101 is made of a compound semiconductor, such as an alloy semiconductor, such as SiGe or GaAsP, silicon carbide, gallium arsenide, gallium phosphide, indium phosphide, indium arsenide, or a combination thereof, in accordance with some embodiments.

The semiconductor layer 102 is made of a semiconductor material different from that of the semiconductor layer 101, in accordance with some embodiments. The semiconductor layer 102 and the substrate 110 are made of the same material, in accordance with some embodiments. The semiconductor layer 102 is made of an elementary semiconductor material including silicon or germanium in a single crystal structure, a polycrystal structure, or an amorphous structure.

In some other embodiments, the semiconductor layer 102 is made of a compound semiconductor, such as silicon carbide, gallium arsenide, gallium phosphide, indium phosphide, indium arsenide, an alloy semiconductor, such as SiGe or GaAsP, or a combination thereof.

As shown in FIGS. 1A, 1A-1 and 1A-2, nanostructure stacks 120 are formed over the semiconductor layer 102 over the fins 112, in accordance with some embodiments. Each nanostructure stack 120, the semiconductor layers 101 and 102 thereunder, and the fin 112 thereunder together form a fin structure FS, in accordance with some embodiments.

Each nanostructure stack 120 includes nanostructures 121, 122, 123, 124, 125, and 126, in accordance with some embodiments. The nanostructures 121, 122, 123, 124, 125, and 126 are sequentially stacked over the corresponding fin 112, in accordance with some embodiments. The nanostructures 121, 122, 123, 124, 125, and 126 include nanowires or nanosheets, in accordance with some embodiments.

The nanostructures 121, 123, and 125 are all made of the same first material, in accordance with some embodiments.

The first material is different from the material of the substrate 110, in accordance with some embodiments. The first material includes an elementary semiconductor material including silicon or germanium in a single crystal structure, a polycrystal structure, or an amorphous structure, in accordance with some embodiments.

The first material includes a compound semiconductor, such as an alloy semiconductor, such as SiGe or GaAsP, silicon carbide, gallium arsenide, gallium phosphide, indium phosphide, indium arsenide, or a combination thereof, in accordance with some embodiments.

The nanostructures 122, 124, and 126 are all made of the same second material, in accordance with some embodiments. The second material is different from the first material, in accordance with some embodiments. The second material is the same as the material of the substrate 110, in accordance with some embodiments. The second material includes an elementary semiconductor material including silicon or germanium in a single crystal structure, a polycrystal structure, or an amorphous structure, in accordance with some embodiments.

The second material includes a compound semiconductor, an alloy semiconductor, or a combination thereof, in accordance with some embodiments. The compound semiconductor includes silicon carbide, gallium arsenide, gallium phosphide, indium phosphide, indium arsenide, a combination thereof, or another suitable compound semiconductor material, in accordance with some embodiments. The alloy semiconductor includes SiGe, SiGeSn, SiGeC, SiSn, GaAsP, GeSn, a combination thereof, or another suitable alloy semiconductor material, in accordance with some embodiments.

As shown in FIGS. 1A, 1A-1 and 1A-2, an isolation layer 130 is formed over the base 111, in accordance with some embodiments. The fin structures FS are partially embedded in the isolation layer 130, in accordance with some embodiments. The fin structures FS are surrounded by the isolation layer 130, in accordance with some embodiments.

The isolation layer 130 is made of a dielectric material such as an oxide-containing material (e.g., silicon oxide), an oxynitride-containing material (e.g., silicon oxynitride), a low-k (low dielectric constant) material, a porous dielectric material, glass, or a combination thereof, in accordance with some embodiments. The glass includes borosilicate glass (BSG), phosphoric silicate glass (PSG), borophosphosilicate glass (BPSG), fluorinated silicate glass (FSG), or a combination thereof, in accordance with some embodiments.

The isolation layer 130 is formed using a deposition process (or a spin-on process), a chemical mechanical polishing process, and an etching back process, in accordance with some embodiments. The deposition process includes a chemical vapor deposition (CVD) process, a high density plasma chemical vapor deposition (HDPCVD) process, a flowable chemical vapor deposition (FCVD) process, a sputtering process, or a combination thereof, in accordance with some embodiments.

Figures 1B, 1C:
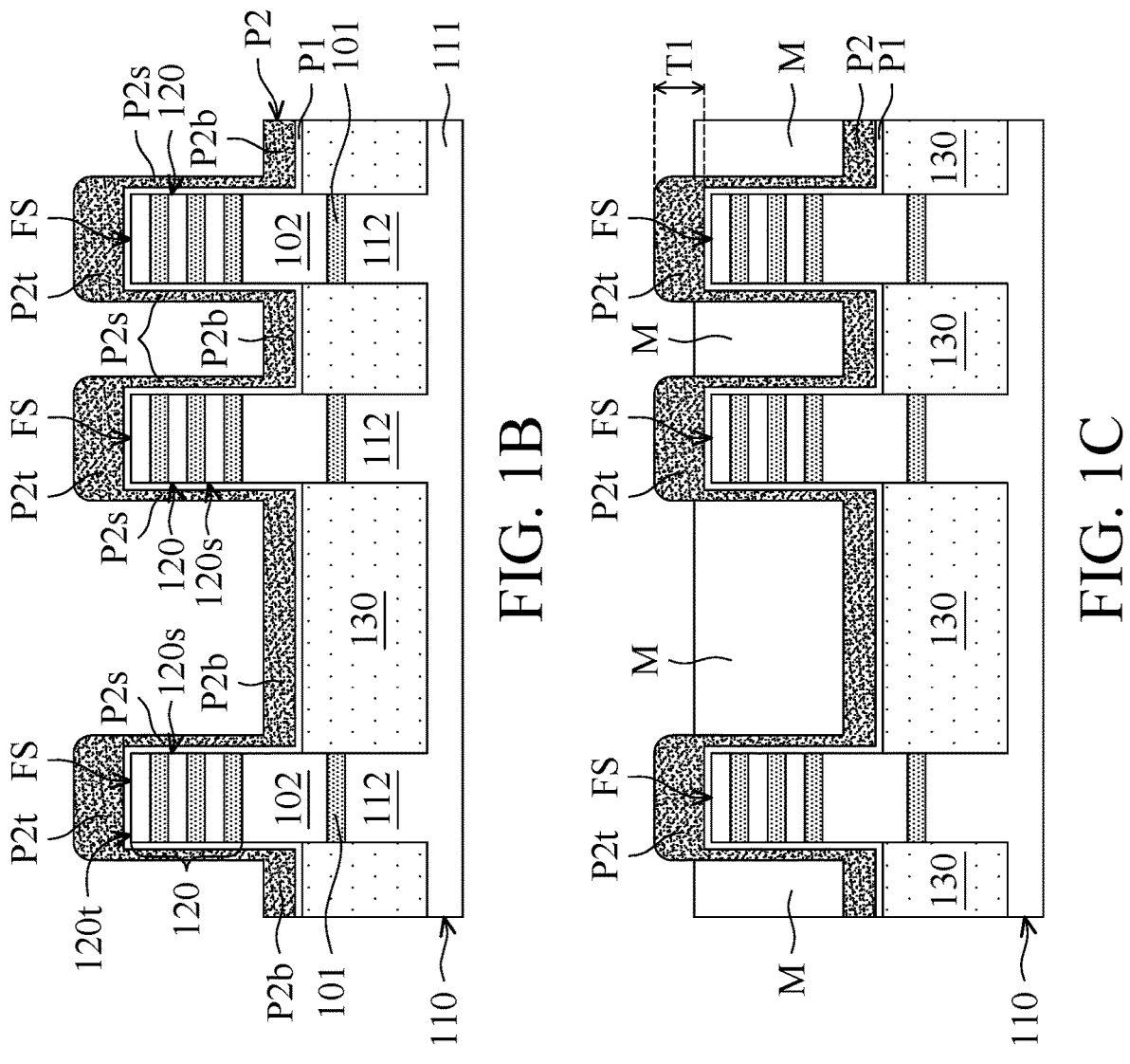

As shown in FIG. 1B, a protection layer P1 is formed over the fin structures FS and the isolation layer 130, in accordance with some embodiments. The protection layer P1 conformally covers the fin structures FS and the isolation layer 130, in accordance with some embodiments.

The protection layer P1 is made of an oxide-containing material, such as silicon oxide, in accordance with some embodiments. The protection layer P1 is formed using a deposition process, such as a chemical vapor deposition process or an atomic layer deposition, in accordance with some embodiments.

As shown in FIG. 1B, a protection layer P2 is formed over the protection layer P1, in accordance with some embodiments. The protection layer P2 is thicker than the protection layer P1, in accordance with some embodiments. The protection layer P2 has a top portion P2$t$, a sidewall portion P2$s$, and a bottom portion P2$b$, in accordance with some embodiments.

The top portion P2$t$ covers the top surfaces 120$t$ of the nanostructure stacks 120, in accordance with some embodiments. The sidewall portion P2$s$ covers the sidewalls 120$s$ of the nanostructure stacks 120, in accordance with some embodiments. The bottom portion P2$b$ covers the isolation layer 130, in accordance with some embodiments. The top portion P2$t$ is thicker than the sidewall portion P2$s$, in accordance with some embodiments. The bottom portion P2$b$ is thicker than the sidewall portion P2$s$, in accordance with some embodiments.

The protection layer P1 and the protection layer P2 are made of different materials, in accordance with some embodiments. The protection layer P2 is made of a nitride-containing material, such as silicon nitride or silicon carbonitride (SiCN), in accordance with some embodiments. The protection layer P2 is formed using a deposition process, such as a chemical vapor deposition process or a physical vapor deposition process, in accordance with some embodiments.

As shown in FIG. 1C, a mask layer M is formed over the protection layer P2, in accordance with some embodiments. The top portion P2$t$ of the protection layer P2 protrudes from the mask layer M, in accordance with some embodiments. The mask layer M is made of a nitride-containing material, an organic material, and/or a oxide-containing material, in accordance with some embodiments.

The mask layer M is also referred to as a bottom anti-reflective coating (BARC) layer, in accordance with some embodiments. The mask layer M is formed using a deposition process and an etching-back process, in accordance with some embodiments.

Figures 1D, 1E:
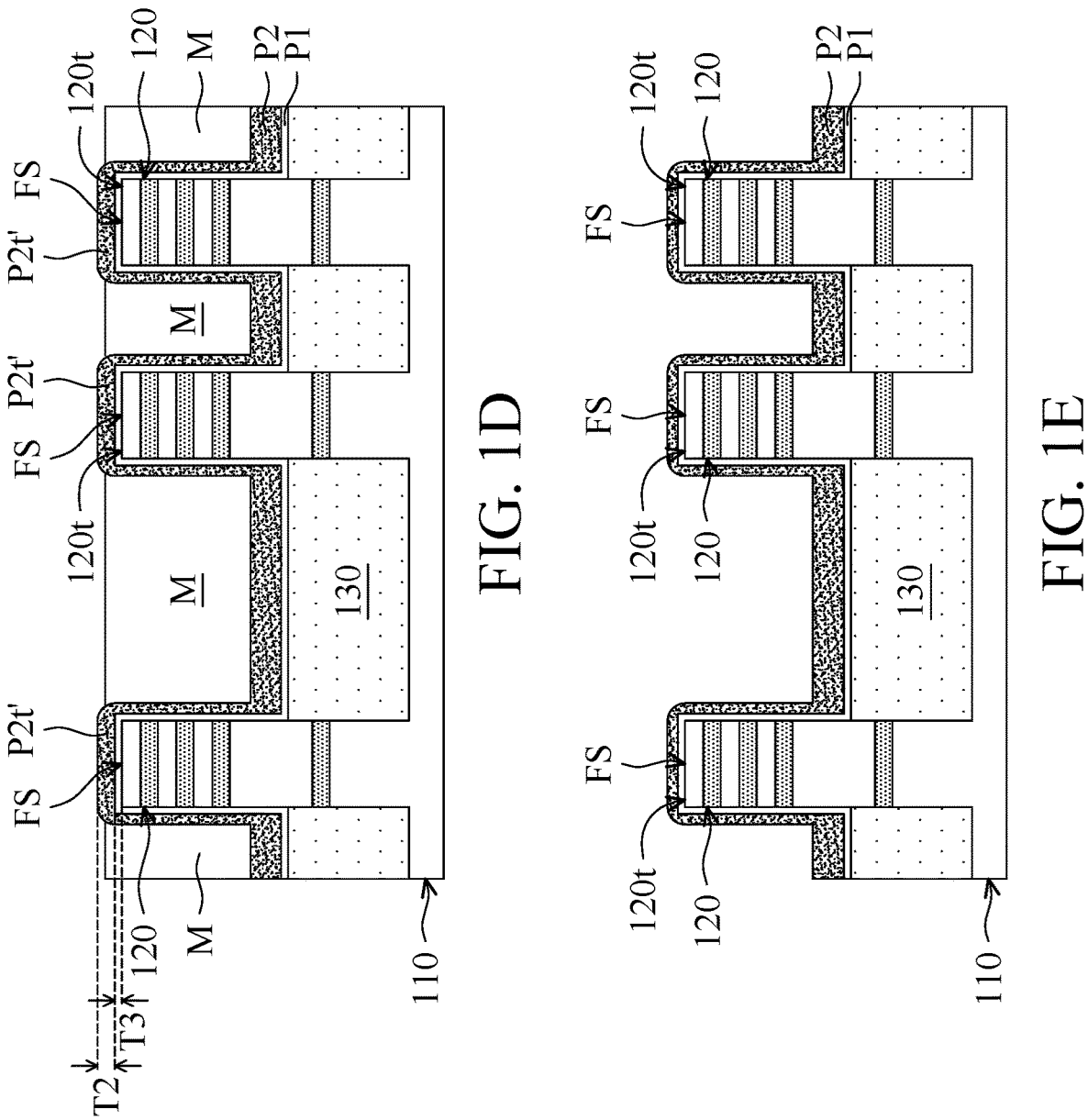

As shown in FIGS. 1C and 1D, the top portion P2$t$ of the protection layer P2 is thinned, and therefore the top portion P2$t$ becomes a thinned top portion P2$t'$ after the top portion P2$t$ is thinned, in accordance with some embodiments. The thinned top portion P2$t'$ is thinner than the top portion P2$t$, in accordance with some embodiments. The thinned top portion P2$t'$ protrudes from the mask layer M, in accordance with some embodiments.

In some embodiments, a ratio of the thickness T2 of the thinned top portion P2$t'$ to the thickness T1 of the top portion P2$t$ ranges from about 0.15 to about 0.25. If the ratio of the thickness T2 to the thickness T1 is less than 0.15, the thinned top portion P2$t'$ is too thin to protect the protection layer P1 thereunder in the subsequent processes, in accordance with some embodiments.

If the ratio of the thickness T2 to the thickness T1 is greater than 0.25, the thinned top portion P2$t'$ is too thick, which is not conducive to remove the thinned top portion P2$t'$ in the subsequent processes, in accordance with some embodiments.

The thinned top portion P2$t'$ of the protection layer P2 is thicker than the protection layer P1, in accordance with some embodiments. In some embodiments, a ratio of the thickness T2 of the thinned top portion P2$t'$ to the thickness T3 of the protection layer P1 ranges from about 1.5 to about 2.5. If the ratio of the thickness T2 to the thickness T3 is less than 1.5, the thinned top portion P2$t'$ is too thin to protect the protection layer P1 thereunder in the subsequent processes, in accordance with some embodiments.

If the ratio of the thickness T2 to the thickness T3 is greater than 2.5, the thinned top portion P2t' is too thick, which is not conducive to remove the thinned top portion P2t' in the subsequent processes, in accordance with some embodiments.

The thinning process includes a physical etching process, in accordance with some embodiments. The physical etching process includes a plasma etching process, in accordance with some embodiments.

As shown in FIG. 1E, the mask layer M is removed, in accordance with some embodiments. The removal process includes an ashing process, in accordance with some embodiments. The ashing process uses a process gas including $N_2H_2$, in accordance with some embodiments.

Since the thinned top portion P2t' of the of the protection layer P2 covers the top surfaces 120t of the nanostructure stacks 120 during the removal process, the thinned top portion P2t' protects the top surfaces 120t of the nanostructure stacks 120 from damage, in accordance with some embodiments.

Figure 1F:
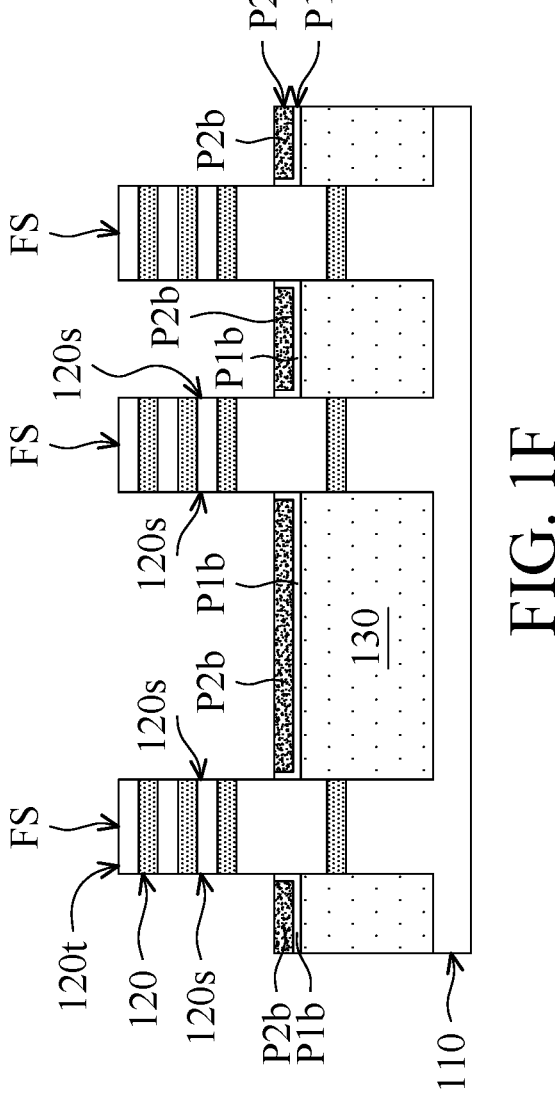

As shown in FIG. 1F, the protection layer P1 and the protection layer P2 over the nanostructure stacks 120 are removed, in accordance with some embodiments. After the removal process, a bottom portion P1b of the protection layer P1 and a bottom portion P2b of the protection layer P2 remain over the isolation layer 130, in accordance with some embodiments.

The removal process includes a dry etching process for removing the protection layer P2 and a wet etching process for removing the protection layer P1, in accordance with some embodiments. The dry etching process includes a radical surface treatment (RST), in accordance with some embodiments. The process gas of the dry etching process includes $NH_3$, $H_2$, $O_2$, and/or Ar, in accordance with some embodiments. The etchant of the wet etching process includes dilute hydrofluoric acid (HF), in accordance with some embodiments.

Figure 1G:
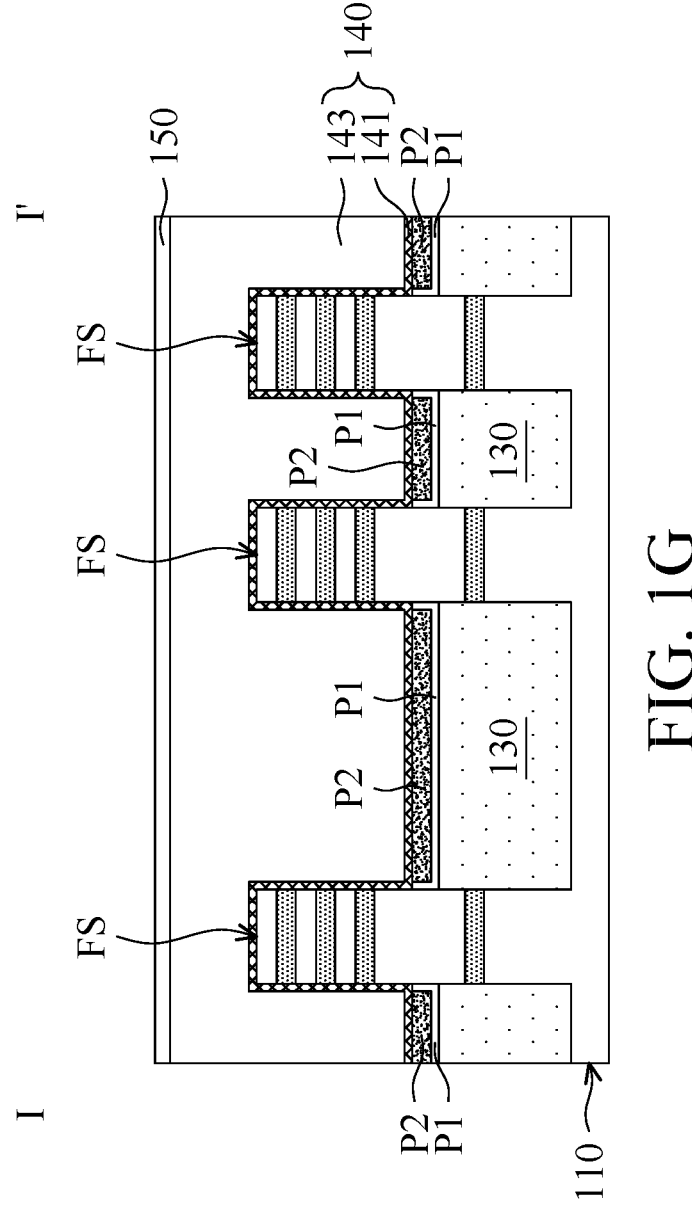
Figures 1, 1G, 2:
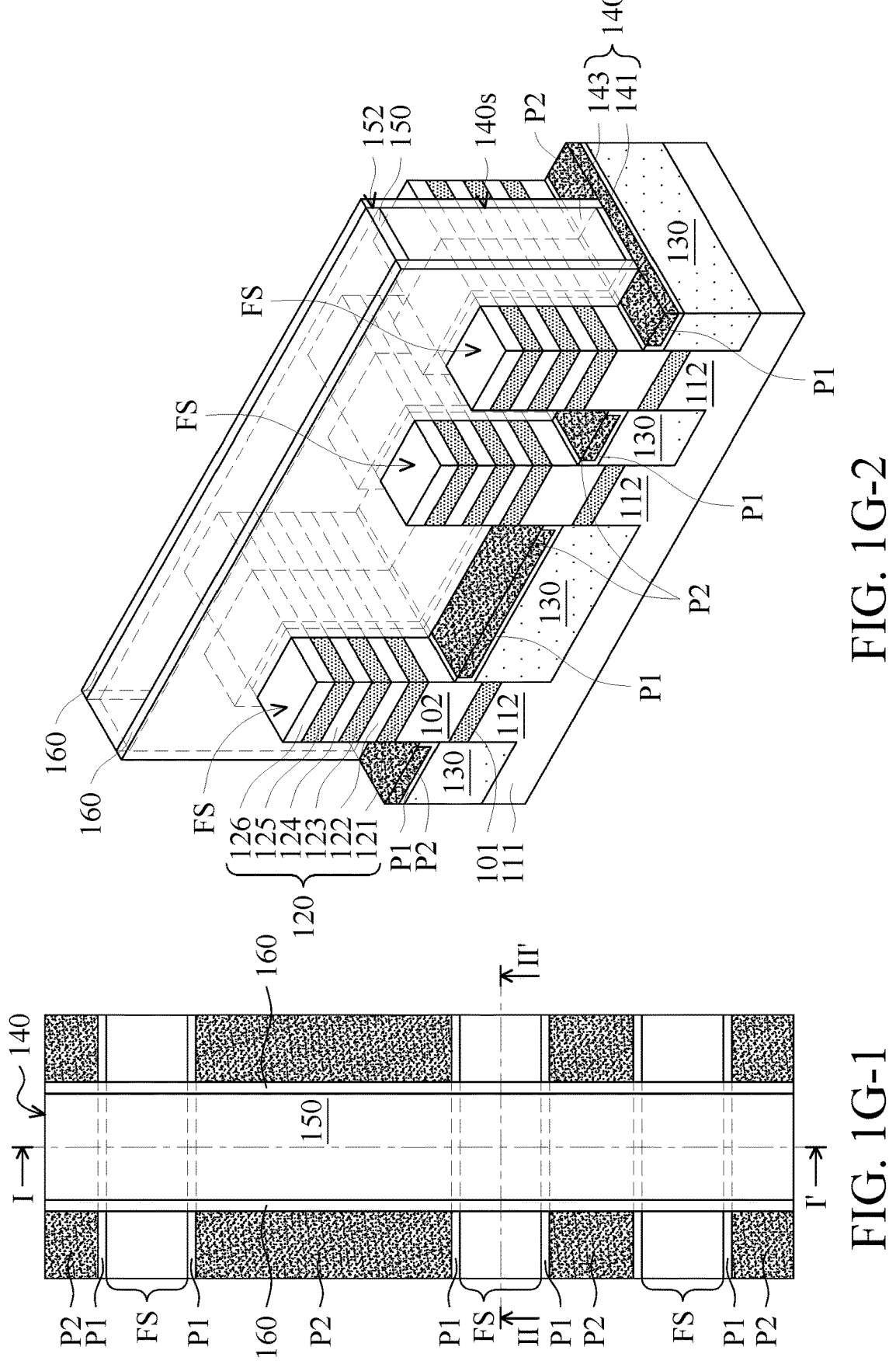

FIG. 1G-1 is a top view of the semiconductor device structure of FIG. 1G, in accordance with some embodiments. FIG. 1G is a cross-sectional view illustrating the semiconductor device structure along a sectional line I-I' in FIG. 1G-1, in accordance with some embodiments.

Figure 2A:
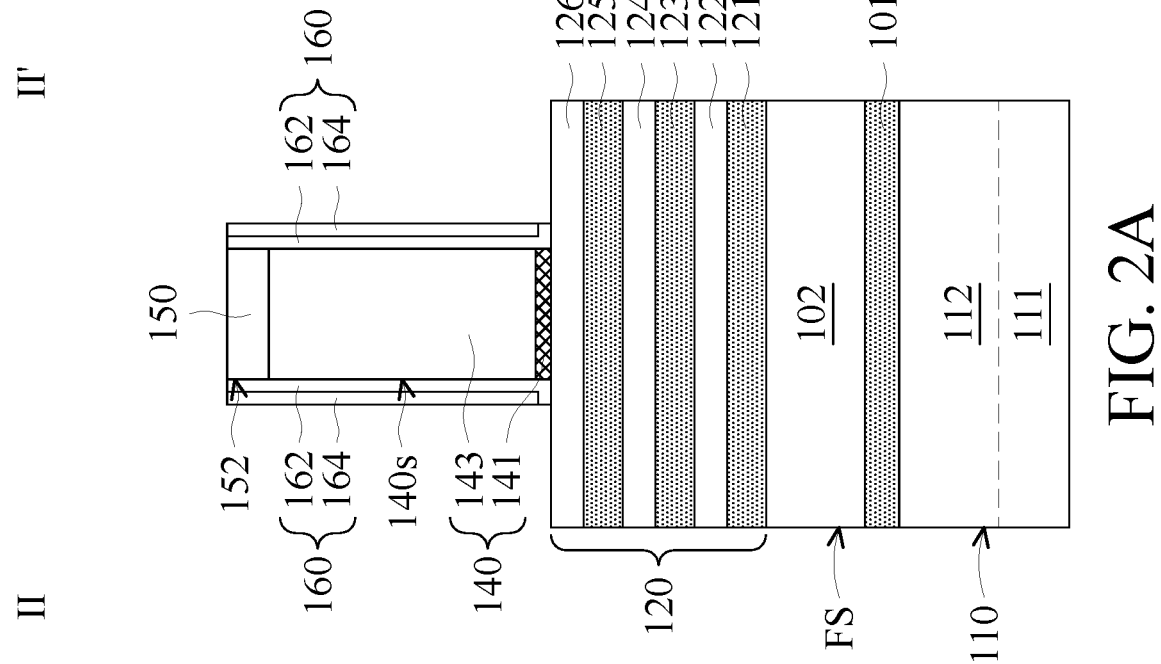
FIGS. 2A-2F are cross-sectional views of various stages of a process for forming a semiconductor device structure, in accordance with some embodiments.

FIG. 1G-2 is a perspective view of the semiconductor device structure of FIG. 1G, in accordance with some embodiments. FIG. 2A is a cross-sectional view illustrating the semiconductor device structure along a sectional line II-II' in FIG. 1G-1, in accordance with some embodiments.

As shown in FIGS. 1G, 1G-1, and 1G-2, a gate stack 140 and a mask layer 150 are formed over the fin structures FS and the protection layers P1 and P2, in accordance with some embodiments.

The gate stack 140 includes a gate dielectric layer 141 and a gate electrode 143, in accordance with some embodiments. The gate electrode 143 is over the gate dielectric layer 141, in accordance with some embodiments.

The gate dielectric layer 141 is positioned between the gate electrode 143 and the fin structures FS, in accordance with some embodiments. The gate dielectric layer 141 is positioned between the gate electrode 143 and the protection layers P1 and P2, in accordance with some embodiments.

The gate dielectric layer 141 is made of an oxide-containing material such as silicon oxide, in accordance with some embodiments. The gate dielectric layer 141 is formed using a chemical vapor deposition process and an etching process, in accordance with some embodiments.

The gate electrode 143 is made of a semiconductor material such as polysilicon, in accordance with some embodiments. The gate electrode 143 is formed using a chemical vapor deposition process and an etching process, in accordance with some embodiments.

The mask layer 150 is positioned over the gate stack 140, in accordance with some embodiments. The mask layer 150 is made of a different material than the gate stack 140, in accordance with some embodiments. The mask layer 150 is made of nitrides (e.g., silicon nitride) or oxynitride (e.g., silicon oxynitride), in accordance with some embodiments.

As shown in FIGS. 1G-1, 1G-2 and 2A, a gate spacer 160 is formed over sidewalls 140s and 152 of the gate stack 140 and the mask layer 150, in accordance with some embodiments. The gate spacer 160 surrounds the gate stack 140 and the mask layer 150, in accordance with some embodiments.

As shown in FIGS. 1G-2 and 2A, the gate spacer 160 is positioned over the fin structures FS and the protection layers P1 and P2, in accordance with some embodiments. In some embodiments, the gate spacer 160 includes layers 162 and 164. The layer 162 conformally covers the fin structures FS thereunder and the sidewalls 140s and 152 of the gate stack 140 and the mask layer 150, in accordance with some embodiments. The layer 164 is over the layer 162, in accordance with some embodiments.

The layers 162 and 164 are made of different materials, in accordance with some embodiments. The etch resistance of the layer 164 is greater than that of the layer 162, in accordance with some embodiments. The dielectric constant of the layer 164 is greater than that of the layer 162, in accordance with some embodiments.

The gate spacer 160 are made of a dielectric material such as an oxide-containing material (e.g., silicon oxide or SiCO), an nitride-containing material (e.g., silicon nitride or SiCN), an oxynitride-containing material (e.g., silicon oxynitride or SiCON), or a high-K material (e.g., $HfO_2$, $La_2O_3$, CaO, $ZrO_2$, $HfZrO_2$, or $Al_2O_3$), in accordance with some embodiments. The k-value of the high-K material is greater than 7.

The gate spacer 160 is made of a material different from that of the gate stack 140 and the mask layer 150, in accordance with some embodiments. The formation of the gate spacer 160 includes deposition processes and an anisotropic etching process, in accordance with some embodiments.

Figure 2C:
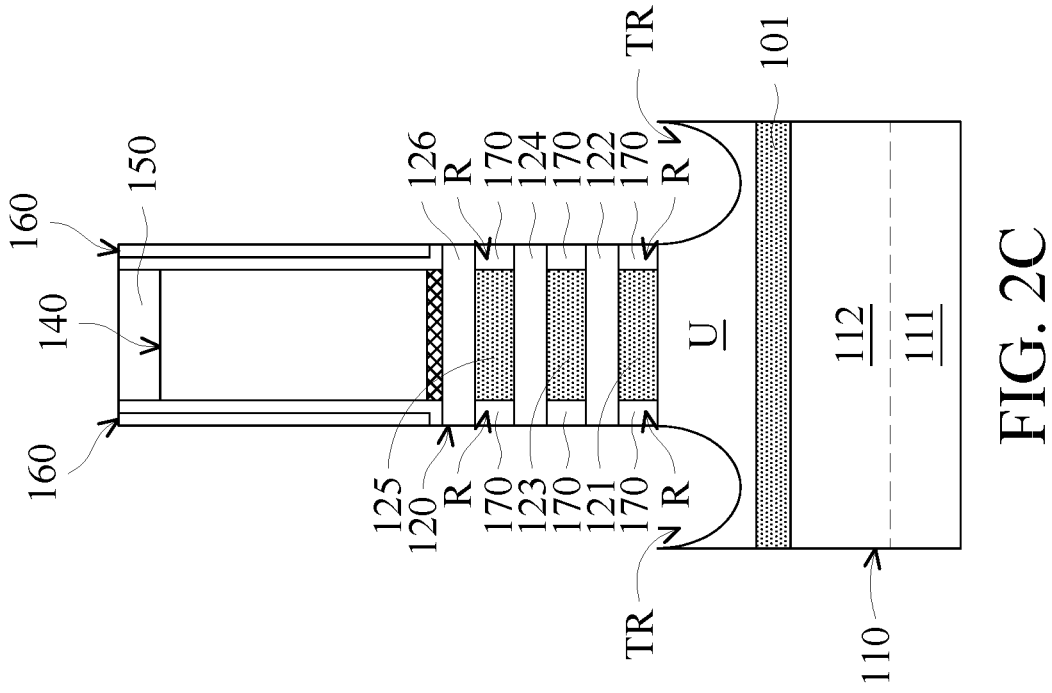
Figure 2B:
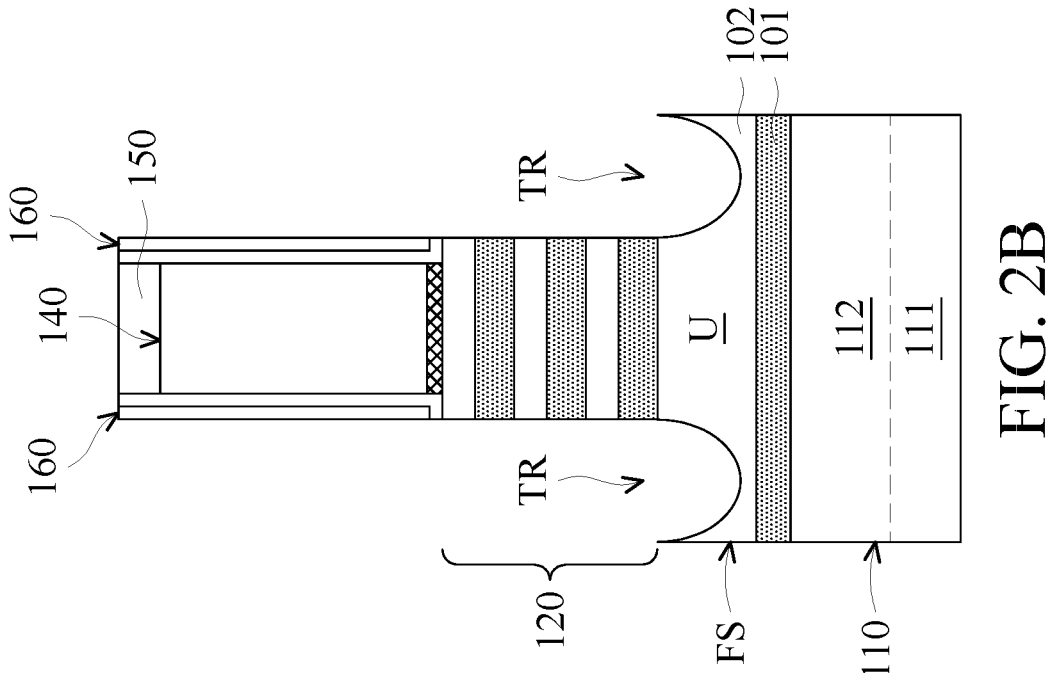

FIGS. 2A-2F are cross-sectional views of various stages of a process for forming a semiconductor device structure, in accordance with some embodiments. After the step of FIG. 2A, as shown in FIG. 2B, portions of the fin structure FS, which are not covered by the gate stack 140 and the gate spacer 160, are removed, in accordance with some embodiments. The removal process forms trenches TR in the fin structure FS, in accordance with some embodiments.

As shown in FIG. 2B, the trenches TR pass through the nanostructure stack 120, in accordance with some embodiments. As shown in FIG. 2B, sidewalls of the nanostructure stacks 120 are substantially aligned with (or substantially coplanar with) sidewalls of the gate spacer 160 thereover, in accordance with some embodiments.

As shown in FIG. 2B, an upper portion U of the semiconductor layer 102 is remained under the gate stack 140 and the gate spacer 160 after the removal process, in accordance with some embodiments. The upper portion U is also referred to as a channel portion, in accordance with some embodiments.

The removal process includes an etching process, in accordance with some embodiments. The etching process includes an anisotropic etching process such as a dry etching process, in accordance with some embodiments.

As shown in FIG. 2C, portions of the nanostructures 121, 123, and 125 are removed through the trenches TR, in accordance with some embodiments. The removal process forms recesses R, in accordance with some embodiments. The recesses R are in the nanostructure stack 120, in accordance with some embodiments.

As shown in FIG. 2C, an inner spacer layer 170 is formed in the recesses R, in accordance with some embodiments. The inner spacer layer 170 is in direct contact with the nanostructure stack 120, in accordance with some embodiments.

As shown in FIG. 2C, the sidewalls of the inner spacer layer 170 are substantially aligned with (or substantially coplanar with) the sidewalls of the gate spacer 160 thereover, in accordance with some embodiments.

The inner spacer layer 170 is made of an insulating material, such as an oxide-containing material (e.g., silicon oxide or SiCO), a nitride-containing material (e.g., silicon nitride or SiCN), an oxynitride-containing material (e.g., silicon oxynitride or SiCON), a carbide-containing material (e.g., silicon carbide), a high-K material (e.g., $HfO_2$, $La_2O_3$, CaO, $ZrO_2$, $HfZrO_2$, or $Al_2O_3$), or a low-k material, in accordance with some embodiments.

The k-value of the high-K material is greater than 7. The term "low-k material" means a material having a dielectric constant less than the dielectric constant of silicon dioxide, in accordance with some embodiments.

In some embodiments, the inner spacer layer 170 is formed using a deposition process and an etching process. The deposition process includes a physical vapor deposition process, a chemical vapor deposition process, an atomic layer deposition process, or the like, in accordance with some embodiments. In some other embodiments, the inner spacer layer 170 is formed using a selective deposition process such as an atomic layer deposition process.

Figure 2E:
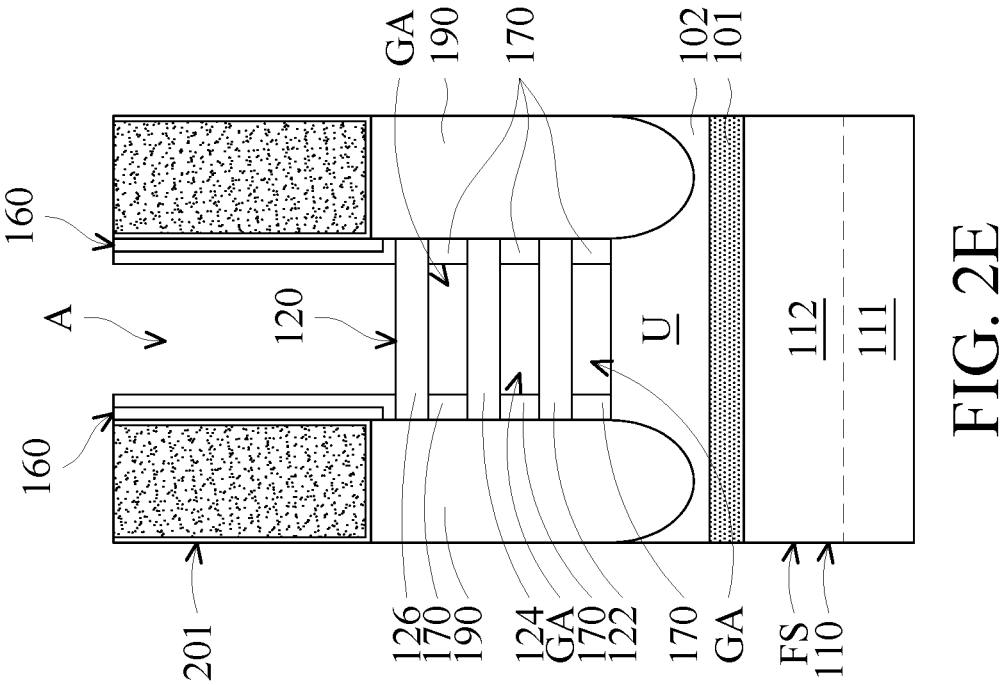
Figure 2D:
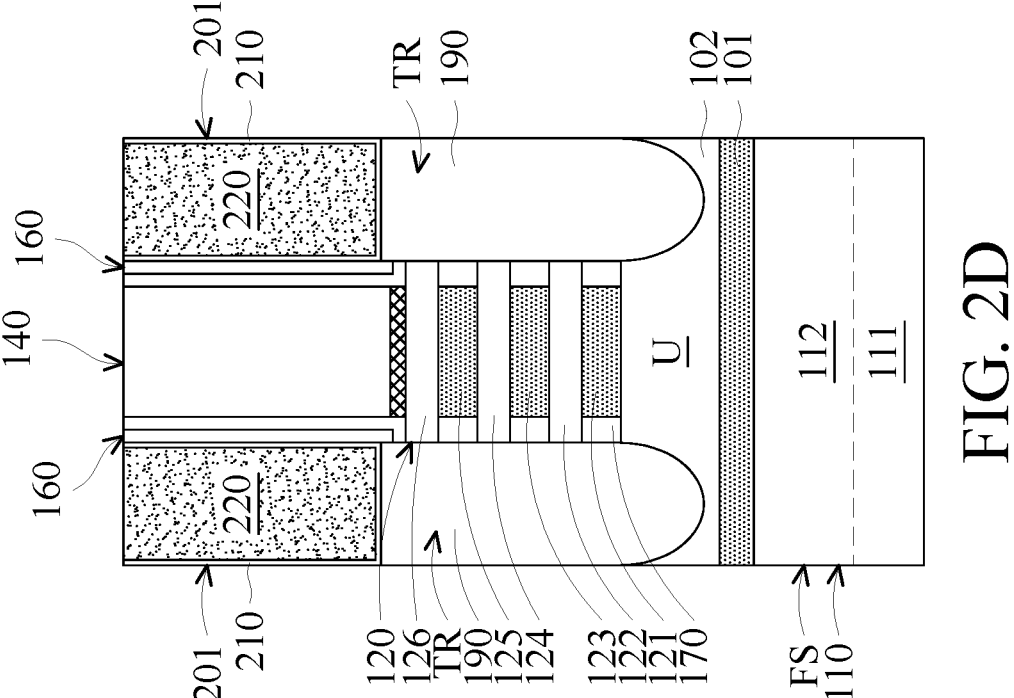

As shown in FIG. 2D, source/drain structures 190 are formed in the trenches TR and over the fin structure FS, in accordance with some embodiments. The nanostructure stack 120 is between the source/drain structures 190, in accordance with some embodiments.

The source/drain structures 190 are in direct contact with the nanostructures 122, 124, and 126 of the nanostructure stacks 120, the gate spacer 160, and the inner spacer layer 170, in accordance with some embodiments. The source/drain structures 190 are also referred to as stressor structures, in accordance with some embodiments.

In some embodiments, the source/drain structures 190 are made of a semiconductor material and N-type dopants. The source/drain structures 190 are in-situ doped with or implanted with N-type dopants, in accordance with some embodiments. The N-type dopants include the Group VA element, in accordance with some embodiments. The Group VA element includes phosphor (P), antimony (Sb), or another suitable Group VA material.

In some embodiments, a concentration of the Group VA element ranges from about 1E20 atoms/cm³ to about 5E20 atoms/cm³. In some embodiments, the atomic percentage of the Group VA element in the source/drain structures 190 ranges from about 1% to about 5%. The source/drain structures 190 are also referred to as doped structures, in accordance with some embodiments.

In some embodiments, the source/drain structures 190 are made of a semiconductor material (e.g., silicon germanium) with P-type dopants, such as the Group IIIA element, in accordance with some embodiments. The Group IIIA element includes boron or another suitable material. The source/drain structures 190 are formed using an epitaxial process, in accordance with some embodiments.

As shown in FIGS. 1G-2, 2D and 2D-1, an etch stop layer 210 is formed over the source/drain structures 190 and the protection layers P1 and P2, in accordance with some embodiments. The etch stop layer 210 surrounds the gate stack 140, in accordance with some embodiments. The etch stop layer 210 is made of a nitride-containing material, such as silicon nitride or silicon oxynitride, in accordance with some embodiments.

As shown in FIG. 2D, a dielectric layer 220 is formed over the etch stop layer 210, in accordance with some embodiments. The dielectric layer 220 surrounds the gate stack 140, in accordance with some embodiments. The etch stop layer 210 and the dielectric layer 220 together form a dielectric structure 201, in accordance with some embodiments. The dielectric structure 201 surrounds the gate stack 140, in accordance with some embodiments.

The etch stop layer 210 and the dielectric layer 220 are made of different materials, in accordance with some embodiments. The dielectric layer 220 includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 220 is formed by a deposition process (e.g., a chemical vapor deposition process) and a planarization process (e.g., a chemical mechanical polishing process), in accordance with some embodiments. The planarization process may also remove the mask layer 150 and the upper portions of the gate spacer 160.

As shown in FIG. 2E, the gate stack 140 is removed, in accordance with some embodiments. The removal process forms a trench A in the gate spacer 160, in accordance with some embodiments. The removal process includes an etching process such as a wet etching process or a dry etching process, in accordance with some embodiments.

As shown in FIG. 2E, the nanostructures 121, 123, and 125 are removed through the trench A to form gaps GA between the semiconductor layer 102 and the nanostructures 122, 124, and 126, in accordance with some embodiments. The removal process includes an etching process such as a wet etching process or a dry etching process, in accordance with some embodiments.

Figures 1, 2F:
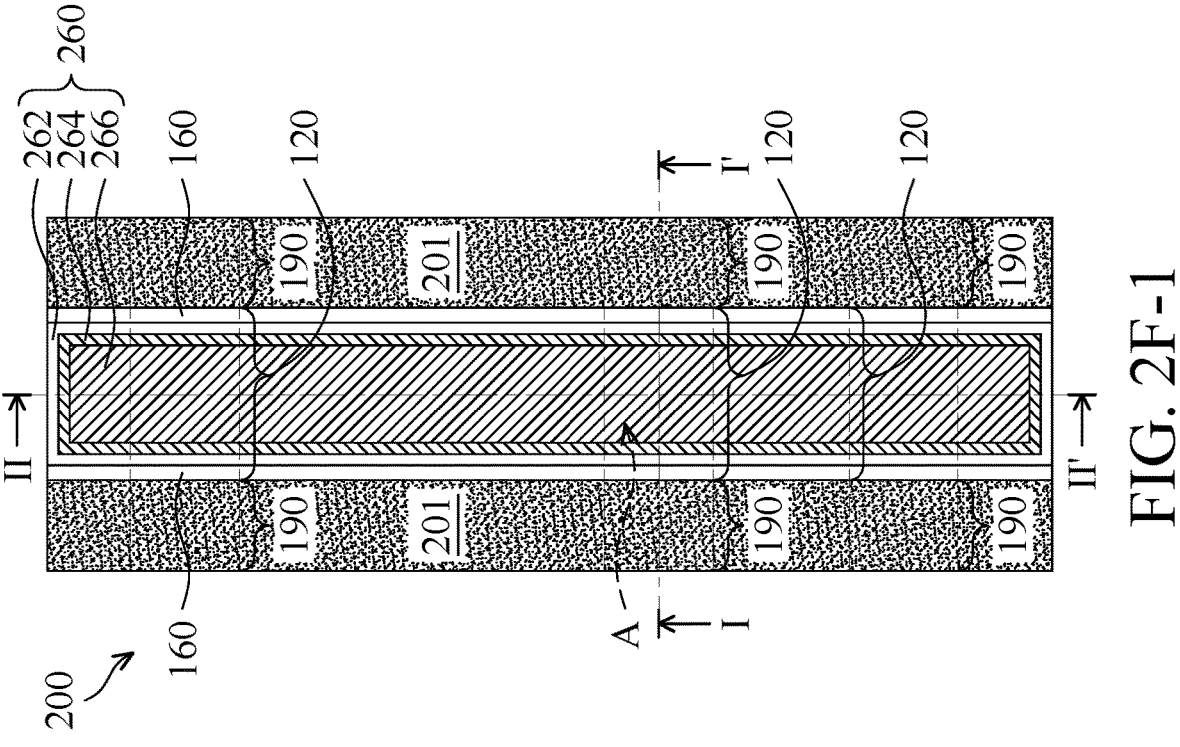
Figure 2F:
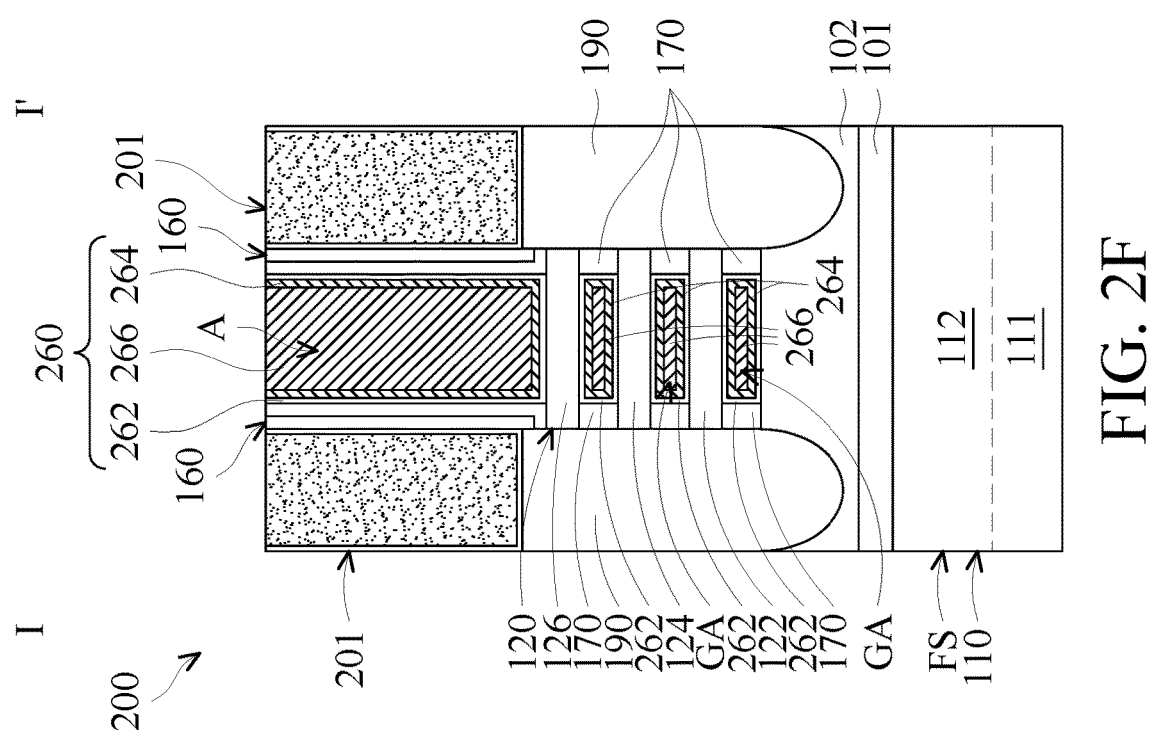
Figures 2, 2F:
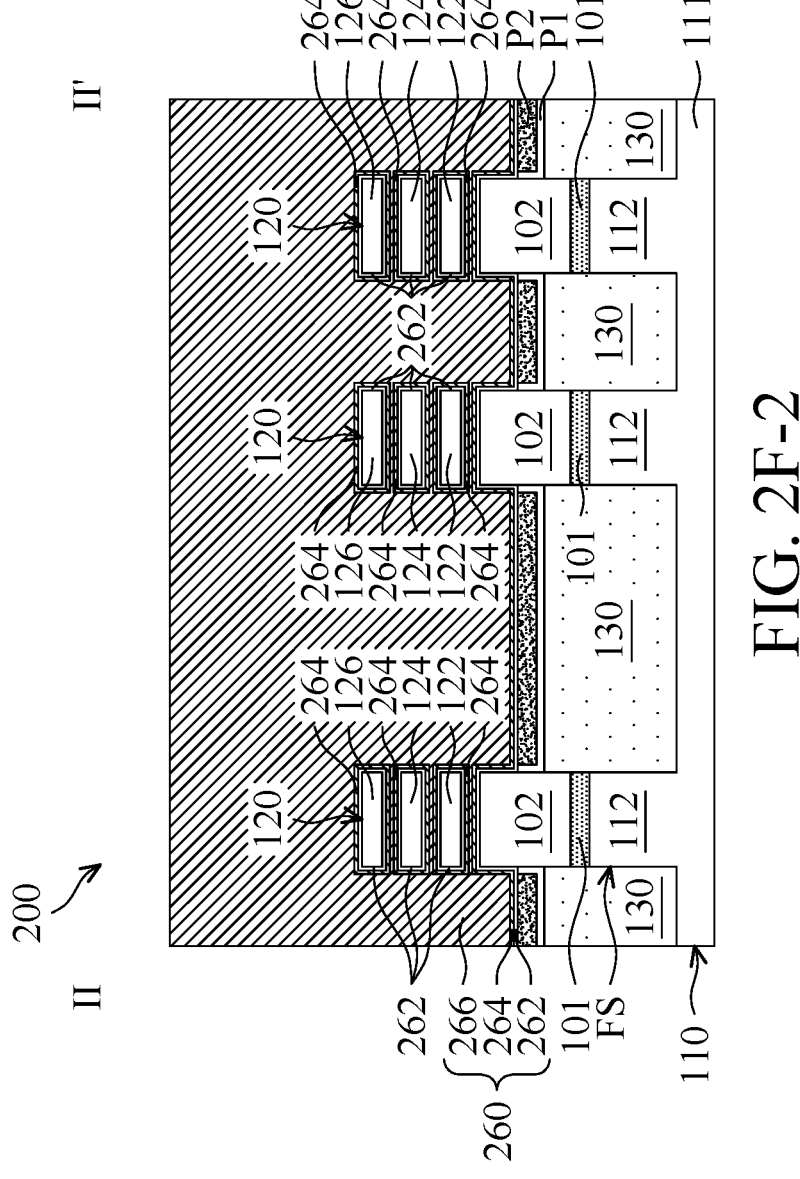

FIG. 2F-1 is a top view of the semiconductor device structure of FIG. 2F, in accordance with some embodiments. FIG. 2F is a cross-sectional view illustrating the semiconductor device structure along a sectional line I-I' in FIG. 2F-1, in accordance with some embodiments. FIG. 2F-2 is a cross-sectional view illustrating the semiconductor device structure along a sectional line II-II' in FIG. 2F-1, in accordance with some embodiments.

As shown in FIGS. 2F, 2F-1 and 2F-2, a gate stack 260 is formed in the trench A and the gaps GA between the semiconductor layer 102 and the nanostructures 122, 124, and 126, in accordance with some embodiments. The trench A and the gaps GA are filled up with the gate stack 260, in accordance with some embodiments.

The gate stack 260 is wrapped around the semiconductor layer 102 and the nanostructures 122, 124, and 126, in accordance with some embodiments. The gate stack 260 includes a gate dielectric layer 262, a work function metal layer 264, and a gate electrode layer 266, in accordance with some embodiments.

The gate dielectric layer 262 is formed over the nanostructures 122, 124, and 126, the semiconductor layer 102, the gate spacer 160, the inner spacer layer 170, and the protection layers P1 and P2, in accordance with some embodiments.

The gate dielectric layer 262 conformally covers the nanostructures 122, 124, and 126, the semiconductor layer 102, the gate spacer 160, the inner spacer layer 170, and the protection layers P1 and P2, in accordance with some embodiments. The gate dielectric layer 262 surrounds the nanostructures 122, 124, and 126, in accordance with some embodiments.

The gate dielectric layer 262 is made of a high-K material, such as $HfO_2$, $La_2O_3$, $CaO$, $ZrO_2$, $HfZrO_2$, or $Al_2O_3$, in accordance with some embodiments. The gate dielectric layer 262 is formed using an atomic layer deposition process or another suitable deposition process and a planarization process such as a chemical mechanical polishing process.

The work function metal layer 264 is conformally formed over the gate dielectric layer 262, in accordance with some embodiments. The work function metal layer 264 provides a desired work function for transistors to enhance device performance including improved threshold voltage.

In the embodiments of forming an NMOS transistor, the work function metal layer 264 can be a metal capable of providing a work function value suitable for the device, such as equal to or less than about 4.5 eV.

The work function metal layer 264 is made of metal, metal carbide, metal nitride, or a combination thereof, in accordance with some embodiments. For example, the work function metal layer 264 is made of tantalum, hafnium carbide, zirconium carbide, tantalum nitride, or a combination thereof.

In the embodiments of forming a PMOS transistor, the work function metal layer 264 can be a metal capable of providing a work function value suitable for the device, such as equal to or greater than about 4.8 eV.

The work function metal layer 264 is made of metal, metal carbide, metal nitride, another suitable material, or a combination thereof, in accordance with some embodiments. For example, the work function metal layer 264 is made of titanium, titanium nitride, another suitable material, or a combination thereof.

The work function metal layer 264 is formed using a deposition process, in accordance with some embodiments. The deposition process includes a physical vapor deposition process, a chemical vapor deposition process, an atomic layer deposition process, or a combination thereof, in accordance with some embodiments.

The gate electrode layer 266 is formed over the work function metal layer 264, in accordance with some embodiments. The gate electrode layer 266 is made of metal, metal nitride, or metal carbide, in accordance with some embodiments. The gate electrode layer 266 is made of tungsten, titanium nitride, tantalum nitride, titanium aluminide, titanium carbide, or a combination thereof, in accordance with some embodiments.

The gate electrode layer 266 is formed using an atomic layer deposition process, a chemical vapor deposition process, or a physical vapor deposition process, in accordance with some embodiments. In this step, a semiconductor device structure 200 is substantially formed, in accordance with some embodiments.

Figures 3A, 3B:
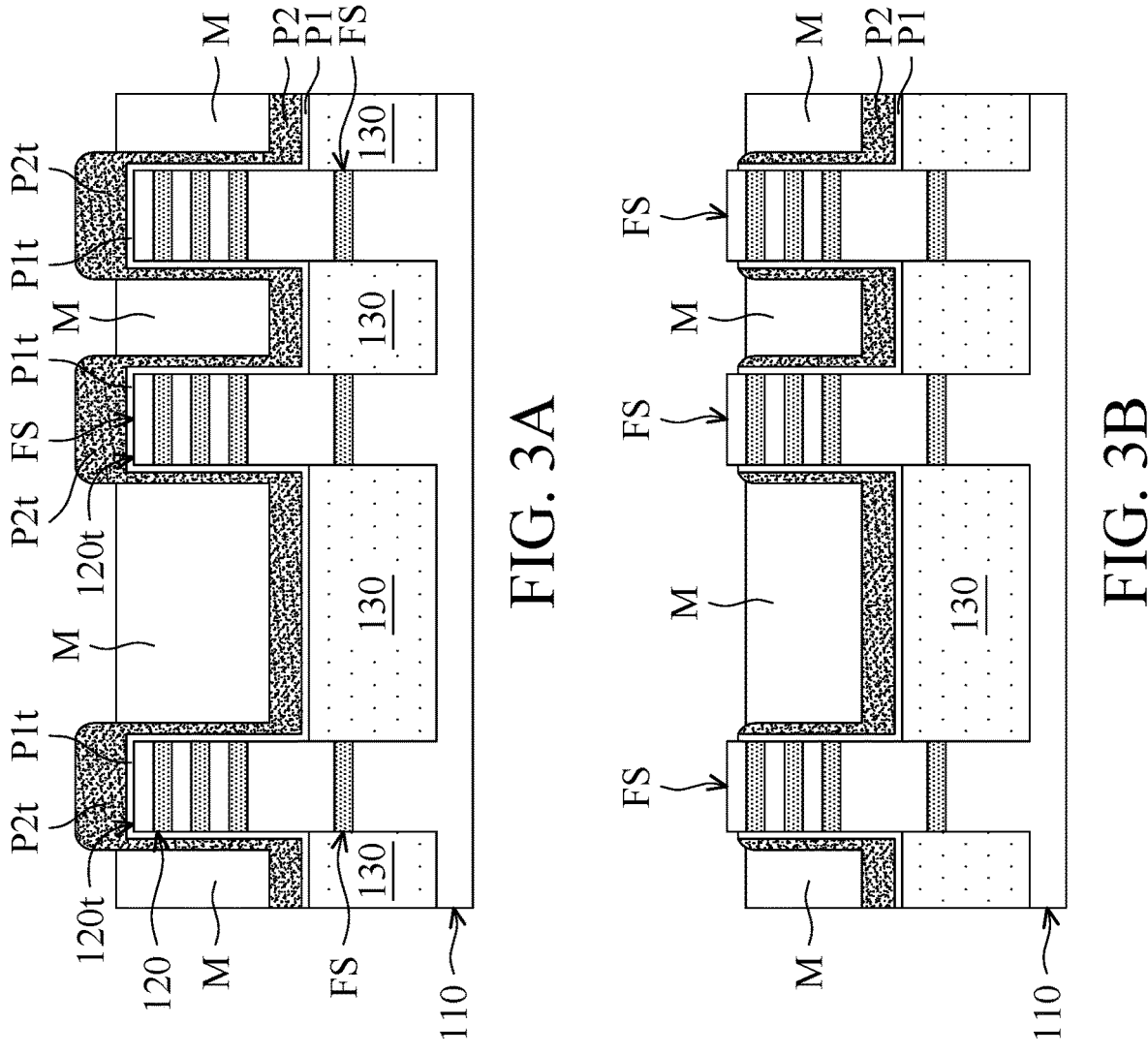
FIGS. 3A-3C are cross-sectional views of various stages of a process for forming a semiconductor device structure, in accordance with some embodiments.
Figure 3C:
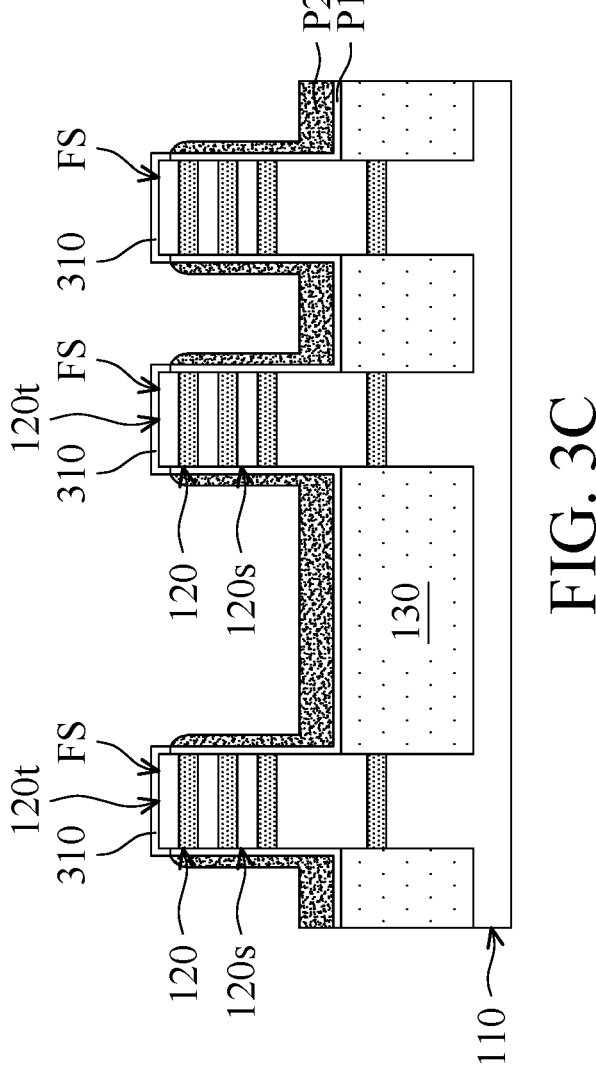
Figures 4A, 4B:
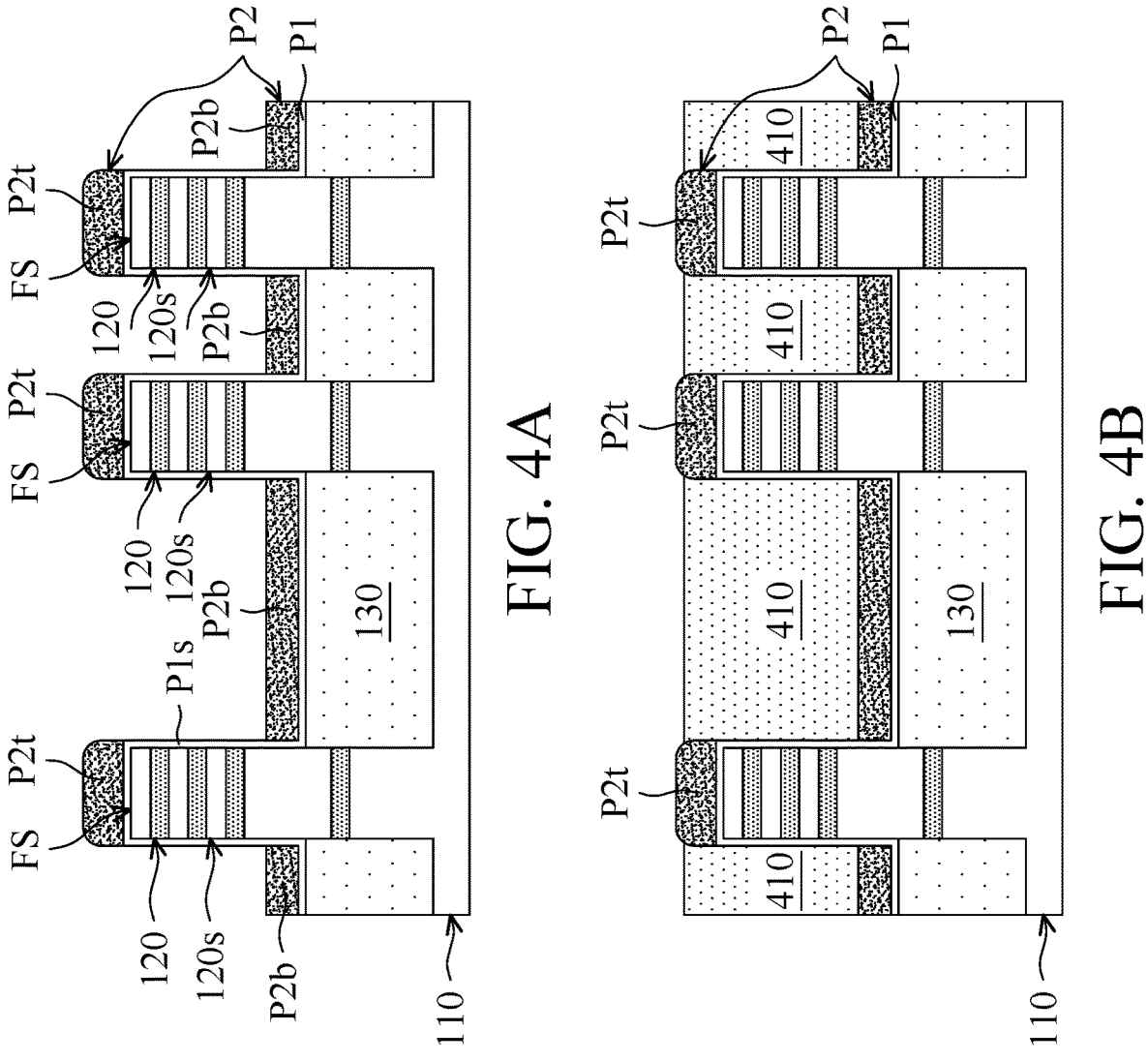
FIGS. 4A-4C are cross-sectional views of various stages of a process for forming a semiconductor device structure, in accordance with some embodiments.
Figure 4C:
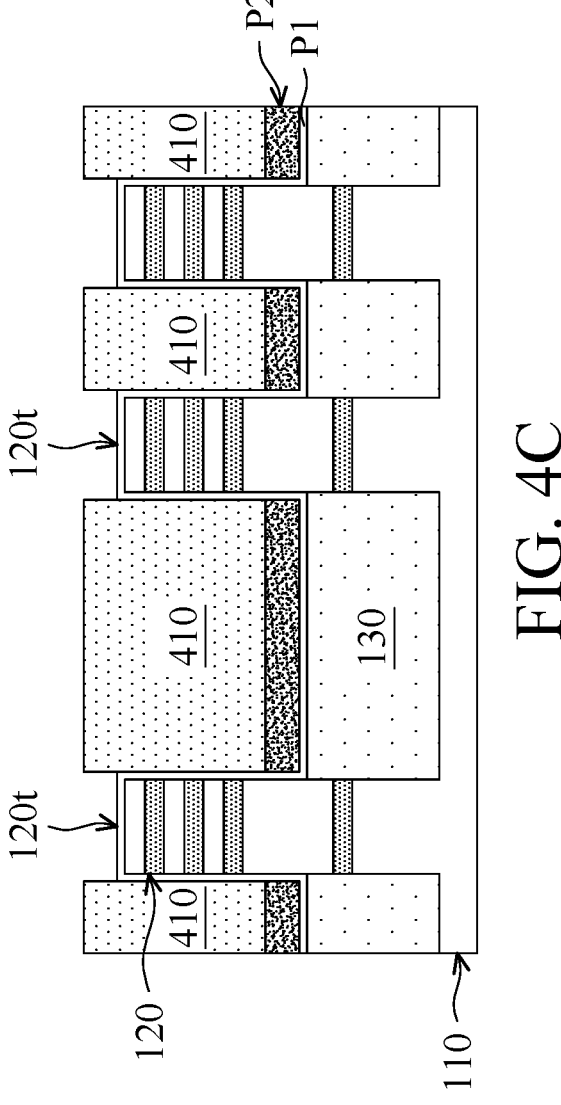

FIGS. 1A-1F illustrate one of the methods for forming the protection layers P1 and P2, in accordance with some embodiments. FIGS. 3A-3C illustrate another one of the methods for forming the protection layers P1 and P2, in accordance with some embodiments. FIGS. 4A-4C illustrate the other one of the methods for forming the protection layers P1 and P2, in accordance with some embodiments.

FIGS. 3A-3C are cross-sectional views of various stages of a process for forming a semiconductor device structure, in accordance with some embodiments. After the step of FIG. 1B, as shown in FIG. 3A, a mask layer M is formed over the protection layer P2, in accordance with some embodiments.

The top portion P2t of the protection layer P2 protrudes from the mask layer M, in accordance with some embodiments. The protection layer P1 has a top portion P1t over the top surfaces 120t of the nanostructure stacks 120, in accordance with some embodiments.

The mask layer M is made of a nitride-containing material, an organic material, and/or a oxide-containing material, in accordance with some embodiments. The mask layer M is also referred to as a bottom anti-reflective coating (BARC) layer, in accordance with some embodiments. The mask layer M is formed using a deposition process and an etching-back process, in accordance with some embodiments.

As shown in FIG. 3A, a cleaning process is performed over the mask layer M and the protection layer P2, in accordance with some embodiments. The cleaning process includes a wet etching process, in accordance with some embodiments. The etchant of the wet etching process includes dilute hydrofluoric acid (HF), in accordance with some embodiments.

As shown in FIG. 3B, the top portion P1t of the protection layer P1 and the top portion P2t of the protection layer P2 are removed, in accordance with some embodiments. The removal process includes a dry etching process for removing the top portion P2t of the protection layer P2 and a wet etching process for removing the top portion P1t of the protection layer P1, in accordance with some embodiments.

The dry etching process includes a radical surface treatment (RST), in accordance with some embodiments. The process gas of the dry etching process includes $NH_3$, $H_2$, $O_2$, and/or Ar, in accordance with some embodiments. The etchant of the wet etching process includes dilute hydrofluoric acid (HF), in accordance with some embodiments.

As shown in FIG. 3C, the mask layer M is removed using a wet etching process, in accordance with some embodiments. The wet etching process uses an etchant including sulfuric acid and hydrogen peroxide, in accordance with some embodiments. The etchant includes a high-temperature sulfuric acid-hydrogen peroxide mixture (HTSPM), in accordance with some embodiments.

As shown in FIG. 3C, a protection layer 310 is formed over the top surfaces 120t and the sidewalls 120s of the nanostructure stacks 120 after the mask layer M is removed, in accordance with some embodiments. The protection layer P2 and the protection layer 310 are made of different materials, in accordance with some embodiments.

The protection layer 310 is made of an oxide-containing material such as silicon oxide, in accordance with some embodiments. The protection layer 310 is formed by oxidizing the exposed portions of the nanostructure stacks 120, in accordance with some embodiments. The protection layer 310 can protect the top surfaces 120t and the sidewalls 120s of the nanostructure stacks 120 from damage caused by the subsequent process, in accordance with some embodiments.

As shown in FIG. 1F, the protection layer P1 and the protection layer P2 over the nanostructure stacks 120 and the protection layer 310 are removed, in accordance with some embodiments. The removal process includes a first etching process for removing the protection layer P2 and a second etching process for removing the protection layers P1 and 310, in accordance with some embodiments.

The first etching process uses an etchant including phosphoric acid, which has a high etching selectivity between silicon nitride and silicon oxide, which protects the protection layer P1 from damage caused by the first etching process, in accordance with some embodiments. The second etching process uses an etchant including dilute hydrofluoric acid (HF), in accordance with some embodiments.

Since the protection layer 310 protects the top surfaces 120t and the sidewalls 120s of the nanostructure stacks 120 from damage caused by the first etching process, the yield of the first etching process is improved, in accordance with some embodiments.

FIGS. 4A-4C are cross-sectional views of various stages of a process for forming a semiconductor device structure, in accordance with some embodiments. After the step of FIG. 1B, as shown in FIG. 4A, the protection layer P2 is thinned until the sidewall portion P2s of the protection layer P2 is removed to expose the sidewall portion P1s of the protection layer P1, in accordance with some embodiments.

The removal process includes an isotropic etching process such as a dry etching process, in accordance with some embodiments. The dry etching process includes a radical surface treatment (RST), in accordance with some embodiments. The process gas of the dry etching process includes $NH_3$, $H_2$, $O_2$, and/or Ar, in accordance with some embodiments.

As shown in FIG. 4B, a mask layer 410 is formed over the protection layer P2, in accordance with some embodiments. The mask layer 410 is in direct contact with the protection layer P1, in accordance with some embodiments.

The mask layer 410 exposes the top portion P2t of the protection layer P2, in accordance with some embodiments. The mask layer 410 contains oxide such as silicon oxide, in accordance with some embodiments. The protection layer P1 also contains oxide such as silicon oxide, in accordance with some embodiments.

The mask layer 410 is formed using a deposition process, an annealing process, and a planarization process, in accordance with some embodiments. The deposition process includes a flowable chemical vapor deposition (FCVD) process, in accordance with some embodiments. The planarization process includes a chemical mechanical polishing process, in accordance with some embodiments.

As shown in FIG. 4C, the top portion P2t of the protection layer P2 is removed, in accordance with some embodiments. The removal process includes an etching process, in accordance with some embodiments.

The etchant of the etching process includes phosphoric acid, which has a high etching selectivity between silicon nitride and silicon oxide, which protects the protection layer P1 from damage caused by the removal process, in accordance with some embodiments. Therefore, the yield of the removal process is improved, in accordance with some embodiments. The protection layer P1 covering the top surfaces 120t of the nanostructure stacks 120 can protects the top surfaces 120t from damage caused by subsequent processes, in accordance with some embodiments.

As shown in FIG. 1F, the mask layer 410 and the protection layer P1 over the nanostructure stacks 120 are removed, in accordance with some embodiments. The removal process includes an etching process such as a dry etching process, in accordance with some embodiments. The process gas of the dry etching process includes $NH_3$ and HF, in accordance with some embodiments.

Since the mask layer 410 and the protection layer P1 both include oxide, the mask layer 410 and the protection layer P1 can be removed in the same removal process, which can simplify the removal process, in accordance with some embodiments.

Elements designated by the same or similar reference numbers as those in FIGS. 1A to 4C have the same or similar structures and the materials. Therefore, the detailed descriptions thereof will not be repeated herein.

In accordance with some embodiments, semiconductor device structures and methods for forming the same are provided. The methods (for forming the semiconductor device structure) sequentially form a first protection layer and a second protection layer over a nanostructure stack and an isolation layer surrounding the nanostructure stack; forming a mask layer over the second protection layer and exposing a top portion of the second protection layer; thinning the top portion of the second protection layer; removing the mask layer; and removing the first protection layer and the second protection layer over the nanostructure stack. Since the thinned top portion of the second protection layer covers the nanostructure stack during the removal process of the mask layer, the thinned top portion can protect the nanostructure stack from damage caused by the removal process of the mask layer, which improves the yield of the removal process of the mask layer. As a result, the reliability and the performance of the semiconductor device structures with the nanostructure stack are improved.

In accordance with some embodiments, a method for forming a semiconductor device structure is provided. The method includes providing a substrate and a nanostructure stack. The substrate has a base and a fin over the base, and the nanostructure stack is over the fin. The method includes forming an isolation layer over the base and surrounding the fin. The method includes forming a first protection layer over the nanostructure stack and the isolation layer. The method includes forming a second protection layer over the first protection layer. A top portion of the second protection layer is over the nanostructure stack, and the first protection layer and the second protection layer are made of different materials. The method includes forming a mask layer over the second protection layer. The top portion of the second protection layer protrudes from the mask layer. The method includes thinning the top portion of the second protection layer. The top portion becomes a thinned top portion after the top portion is thinned. The method includes removing the mask layer. The method includes removing the first protection layer and the second protection layer over the nanostructure stack. The method includes forming a gate stack wrapped around the nanostructure stack.

In accordance with some embodiments, a method for forming a semiconductor device structure is provided. The method includes providing a substrate and a nanostructure stack. The substrate has a base and a fin over the base, and the nanostructure stack is over the fin. The method includes forming an isolation layer over the base and surrounding the fin. The method includes forming a first protection layer over the nanostructure stack and the isolation layer. The first protection layer has a first top portion over a top surface of the nanostructure stack. The method includes forming a second protection layer over the first protection layer. The second protection layer has a second top portion over the first top portion, and the first protection layer and the second protection layer are made of different materials. The method includes forming a mask layer over the second protection layer. The second top portion of the second protection layer protrudes from the mask layer. The method includes removing the first top portion of the first protection layer and the second top portion of the second protection layer. The method includes removing the mask layer using a wet etching process. A third protection layer is formed over the top surface of the nanostructure stack after the mask layer is removed. The method includes removing the first protection layer and the second protection layer over the nanostructure stack and the third protection layer. The method includes forming a gate stack wrapped around the nanostructure stack.

In accordance with some embodiments, a method for forming a semiconductor device structure is provided. The method includes providing a substrate and a nanostructure stack. The substrate has a base and a fin over the base, and the nanostructure stack is over the fin. The method includes forming an isolation layer over the base and surrounding the fin. The method includes forming a first protection layer over the nanostructure stack and the isolation layer. The method includes forming a second protection layer over the first protection layer. A top portion of the second protection layer is over the nanostructure stack, and the first protection layer and the second protection layer are made of different materials. The method includes removing a sidewall portion of the second protection layer over a sidewall of the nanostructure stack. The method includes forming a mask layer over the second protection layer. The mask layer is in direct contact with the first protection layer and exposes the top portion of the second protection layer. The method includes removing the top portion of the second protection layer. The method includes. The method includes removing the mask layer and the first protection layer over the nanostructure stack. The method includes forming a gate stack wrapped around the nanostructure stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

providing a substrate and a nanostructure stack, wherein the substrate has a base and a fin over the base, and the nanostructure stack is over the fin;

forming an isolation layer over the base and surrounding the fin;

forming a first protection layer over the nanostructure stack and the isolation layer;

forming a second protection layer over the first protection layer, wherein a top portion of the second protection layer is over the nanostructure stack, and the first protection layer and the second protection layer are made of different materials;

forming a mask layer over the second protection layer, wherein the top portion of the second protection layer protrudes from the mask layer;

thinning the top portion of the second protection layer, wherein the top portion becomes a thinned top portion after the top portion is thinned;

removing the mask layer;

removing the first protection layer and the second protection layer over the nanostructure stack; and forming a gate stack wrapped around the nanostructure stack.

2. The method for forming the semiconductor device structure as claimed in claim 1, wherein the first protection layer is made of an oxide-containing material.

3. The method for forming the semiconductor device structure as claimed in claim 1, wherein the second protection layer is made of a nitride-containing material.

4. The method for forming the semiconductor device structure as claimed in claim 1, wherein the second protection layer has a sidewall portion over a sidewall of the nanostructure stack, and the top portion of the second protection layer is thicker than the sidewall portion before the top portion is thinned.

5. The method for forming the semiconductor device structure as claimed in claim 1, wherein the second protection layer is thicker than the first protection layer.

6. The method for forming the semiconductor device structure as claimed in claim 1, wherein the thinned top portion of the second protection layer is thicker than the first protection layer.

7. The method for forming the semiconductor device structure as claimed in claim 1, wherein the thinning of the top portion of the second protection layer comprises a physical etching process.

8. The method for forming the semiconductor device structure as claimed in claim 7, wherein the physical etching process comprises a plasma etching process.

9. The method for forming the semiconductor device structure as claimed in claim 1, wherein the thinned top portion of the second protection layer protrudes from the mask layer.

10. The method for forming the semiconductor device structure as claimed in claim 1, wherein a first bottom portion of the first protection layer and a second bottom portion of the second protection layer remain over the isolation layer after the first protection layer and the second protection layer over the nanostructure stack are removed, and the gate stack is over the first bottom portion of the first protection layer and the second bottom portion of the second protection layer.

11. A method for forming a semiconductor device structure, comprising:

forming a protruding structure over a substrate;

forming an isolation layer surrounding a lower portion of the protruding structure;

forming a first protection layer over the protruding structure and the isolation layer;

forming a second protection layer over the first protection layer, wherein the second protection layer has a top portion and a lower portion, the top portion extends along a top of the protruding structure, and the lower portion extends along a sidewall of the protruding structure;

forming a mask layer over the second protection layer;

thinning the top portion of the second protection layer such that the top portion becomes a thinned top portion after the mask layer is formed;

removing the mask layer;

at least partially removing the first protection layer and the second protection layer to expose the top and the sidewall of the protruding structure; and forming a gate stack over the protruding structure.

12. The method for forming the semiconductor device structure as claimed in claim 11, wherein the first protection layer and the second protection layer are made of different materials.

13. The method for forming the semiconductor device structure as claimed in claim 11, wherein the thinning of the top portion of the second protection layer is performed while the lower portion of the second protection layer is covered by the mask layer.

14. The method for forming the semiconductor device structure as claimed in claim 11, wherein the second protection layer has a bottom portion extending along a top of the isolation layer, and the bottom portion of the second protection layer is thicker than the lower portion of the second protection layer.

15. The method for forming the semiconductor device structure as claimed in claim 11, wherein the gate stack is formed to extend across an interface between the first protection layer and the second protection layer.

16. A method for forming a semiconductor device structure, comprising:

forming a protruding structure over a substrate;

forming an isolation layer surrounding a lower portion of the protruding structure;

forming a protection layer over the protruding structure and the isolation layer, wherein a first portion of the protection layer over a top of the protruding structure is thicker than a second portion of the protection layer extending along a sidewall of the protruding structure;

thinning the first portion of the protection layer;

etching the protection layer after the first portion of the protection layer is thinned such that the top and the sidewall of the protruding structure are exposed; and forming a gate stack over the protruding structure.

17. The method for forming the semiconductor device structure as claimed in claim 16, further comprising:

forming a second protection layer over the protruding structure and the isolation layer before the protection layer is formed, wherein the protection layer is thicker than the second protection layer.

18. The method for forming the semiconductor device structure as claimed in claim 17, wherein the protection layer contains nitrogen, and the protection layer and the second protection layer are made of different materials.

19. The method for forming the semiconductor device structure as claimed in claim 16, further comprising:

forming a mask layer laterally surrounding the second portion of the protection layer, where the first portion of the protection layer protrudes from a top of the mask layer; and removing the mask layer after the thinning of the first portion of the protection layer.

20. The method for forming the semiconductor device structure as claimed in claim 16, wherein a remaining portion of the protection layer remains over the isolation layer after the etching of the protection layer, and the gate stack at least partially covers the remaining portion of the protection layer.

* * * * *